US007495270B2

(12) United States Patent
Kweon

(10) Patent No.: US 7,495,270 B2
(45) Date of Patent: Feb. 24, 2009

(54) PLASMA DISPLAY PANEL

(75) Inventor: Tae-Joung Kweon, Suwon-si (KR)

(73) Assignee: Samsung SDI Co., Ltd., Gyeonggi-Do (KR)

( * ) Notice: Subject to any disclaimer, the term of this patent is extended or adjusted under 35 U.S.C. 154(b) by 185 days.

(21) Appl. No.: 11/444,205

(22) Filed: May 30, 2006

(65) Prior Publication Data

US 2007/0029933 A1 Feb. 8, 2007

(30) Foreign Application Priority Data

Aug. 3, 2005 (KR) ...................... 10-2005-0070962

(51) Int. Cl.
*H01L 29/80* (2006.01)
*H01L 31/112* (2006.01)
*H01L 31/0288* (2006.01)

(52) U.S. Cl. ........................ 257/257; 257/237; 313/586

(58) Field of Classification Search ................. 257/237, 257/257, 258; 313/582, 585.586
See application file for complete search history.

(56) References Cited

U.S. PATENT DOCUMENTS 6,577,062 B2 * 6/2003 Itokawa et al. .............. 313/582
2007/0155609 A1 * 7/2007 Choi ........................... 501/32

* cited by examiner

*Primary Examiner*—Phuc T Dang
(74) *Attorney, Agent, or Firm*—Knobbe Martens Olson & Bear LLP

(57) ABSTRACT

Provided is a plasma display panel (PDP), which minimizes an elevation in reflection brightness caused by reflection of external light and improves in contrast and discharge efficiency. The PDP includes a front substrate transmitting visible rays; a rear substrate disposed substantially parallel to the front substrate; barrier ribs interposed between the front and rear substrates and defining a plurality of discharge cells along with the front and rear substrates, the barrier ribs formed of a dielectric material; two or more kinds of discharge electrodes disposed on at least one of the front substrate, the rear substrate, and the barrier ribs; a dielectric layer disposed on a rear surface of the front substrate; phosphor layers disposed in the discharge cells; and a discharge gas filled in the discharge cells. Herein, any two members of the front substrate, the dielectric layer, and the barrier ribs are colored, and when colors that are put in to the two members are mixed using subtractive mixture of colors, the mixed color lowers in both brightness and chroma.

15 Claims, 5 Drawing Sheets

RELATED ART

RELATED ART

< ADDITIVE MIXTURE OF COLORS >

< SUBTRACTIVE MIXTURE OF COLORS >

RELATED ART

< LOWER PLATE >

< ASSEMBLED PANEL >

PLASMA DISPLAY PANEL

CROSS-REFERENCE TO RELATED APPLICATIONS

This application claims the benefit of Korean Patent Application No. 10-2005-0070962, filed on Aug. 3, 2005, in the Korean Intellectual Property Office, the disclosure of which is incorporated herein in its entirety by reference.

BACKGROUND OF THE INVENTION

1. Field of the Invention

The present embodiments relate to a plasma display panel (PDP) used for a plasma display device, and more particularly, to a PDP that improves both contrast and discharge efficiency by reducing residual images and reflection of external light.

2. Description of the Related Art

FIG. 1 is a fragmentary perspective view of a conventional PDP as disclosed in Japanese Patent Laid-Open Publication No. 1998-172442.

As shown in FIG. 1, the conventional PDP includes an upper panel 1 and a lower panel 2, which are bonded to each other, and a space defined by the upper and lower panels 1 and 2 is filled with a discharge gas. The upper panel 1 includes a front substrate 60, pairs of sustain discharge electrodes 84, and a front dielectric layer 80. Each of the pairs of sustain discharge electrodes 84 include a Y-electrode 83 and an X-electrode 82, which are disposed on a bottom surface 60*a* of the front substrate 60. The pairs of sustain discharge electrodes 84 are covered with the front dielectric layer 80. The front dielectric layer 80 may be covered with a protective layer 90 that is typically formed of MgO. Meanwhile, the Y-electrode 83 includes a first transparent electrode 83*b*, which is formed of indium tin oxide (ITO), and a first bus electrode 83*a*, which prevents a voltage drop in the first transparent electrode 83*b*. Like the Y-electrode 83, the X-electrode 82 includes a second transparent electrode 82*b* and a second bus electrode 82*a*.

The lower panel 2 includes a rear substrate 10, address electrodes 20, a rear dielectric layer 30, barrier ribs 40, and phosphor layers 50. The address electrodes 20 are disposed on a top surface of the rear substrate 10 and intersect the pairs of sustain discharge electrodes 84. The address electrodes 20 are covered with the rear dielectric layer 30. The barrier ribs 40 are disposed on the rear dielectric layer 30 and define discharge cells along with the pairs of sustain discharge electrodes 84. The phosphor layers 50 are coated on inner surfaces of the discharge cells.

For the above-described conventional PDP, a discharge cell is selected due to address discharge induced between the address electrode 20 and the Y-electrode 83. Then, sustain discharge arises between the X-electrode 82 and the Y-electrode 83 of the selected discharge cell, so that the discharge cell emits light. More specifically, as the sustain discharge happens, the discharge gas filled in the discharge cell emits ultraviolet rays, which lead the phosphor layers 50 to emit red, green, and blue visible rays, thus producing the image of the PDP.

In the conventional PDP having the above-described construction, external light is projected on a front surface of a display region of the PDP. Owing to this reflection of external light, the PDP has higher reflection brightness and a lower contrast.

Therefore, it has become increasingly necessary to cut off the reflection of external light in order to minimize an elevation in the reflection brightness of the PDP and improve the contrast thereof.

FIG. 3 is a diagram for schematically explaining the principles of additive mixture of colors and subtractive mixture of colors.

As shown in FIG. 3, when the three primary colors of light, that is, red, green, and blue colors, are mixed using the additive mixture of colors, a central portion in which all the three colors are mixed emits white light, and portions in which two of the three colors are mixed emit yellow, azure, and violet light, respectively. Here, it is said that two colors disposed opposite each other across a white color are complementary to each other. In mixing the complementary colors, the mixed color lowers in both brightness and chroma and, preferably, becomes a black color.

When yellow, azure, and violet colors are mixed using the subtractive mixture of colors, a central portion in which all the three colors are mixed takes on a black color, and portions in which two of the three colors are mixed take on red, green, and blue colors, respectively. For example, when the red and azure colors, which are complementary to each other, are mixed, the mixed color lowers in both brightness and chroma. Therefore, by making use of complementary colors as described above, it is expected that there will be improvements in contrast and other problems.

SUMMARY OF THE INVENTION

The present embodiments provide a plasma display panel (PDP), which can minimize an elevation in reflection brightness caused by reflection of external light and improve both contrast and discharge efficiency.

According to an aspect of the present embodiments, there is provided a PDP including a front substrate transmitting visible rays; a rear substrate disposed substantially parallel to the front substrate; barrier ribs interposed between the front and rear substrates and defining a plurality of discharge cells along with the front and rear substrates, the barrier ribs formed of a dielectric material; two or more kinds of discharge electrodes disposed on at least one of the front substrate, the rear substrate, and the barrier ribs; a dielectric layer disposed on a rear surface of the front substrate; phosphor layers disposed in the discharge cells; and a discharge gas filled in the discharge cells. Any two members of the front substrate, the dielectric layer, and the barrier ribs are colored, and when colors that are put in to the two members are mixed using subtractive mixture of colors, the mixed color lowers in both brightness and chroma.

Also, the colors that are put into the two members may be complementary colors, which are mixed using subtractive mixture of colors so that the mixed color takes on a black color. In this case, the PDP can further improve contrast.

According to an aspect of the present embodiments, there is provided a PDP including a front substrate transmitting visible rays; a rear substrate disposed substantially parallel to the front substrate; barrier ribs interposed between the front and rear substrates and defining a plurality of discharge cells along with the front and rear substrates, the barrier ribs formed of a dielectric material; two or more kinds of discharge electrodes disposed on at least one of the front substrate, the rear substrate, and the barrier ribs; a dielectric layer disposed on a rear surface of the front substrate; phosphor layers disposed in the discharge cells; a discharge gas filled in the discharge cells; and a colored transparent thin layer attached to the front substrate. Any one member of the front substrate, the dielectric layer, and the barrier ribs can be colored, and when a color that is put into the one member is mixed with the color of the transparent thin layer using subtractive mixture of colors, the mixed color lowers in both brightness and chroma.

Herein, the thin layer may be attached to a front surface of the front substrate.

The barrier ribs may also be colored.

Also, the colors that are put in to the one colored member and the transparent thin layer may be complementary colors, which are mixed using subtractive mixture of colors so that the mixed color takes on a black color. In this case, the PDP can further improve contrast.

BRIEF DESCRIPTION OF THE DRAWINGS

The above and other features and advantages of the present embodiments will become more apparent by describing in detail exemplary embodiments thereof with reference to the attached drawings in which.

DETAILED DESCRIPTION OF THE INVENTION

A plasma display panel (PDP) according to the present embodiments will now be described more fully hereinafter with reference to the accompanying drawings, in which exemplary embodiments are shown. Hereinafter, the same reference numbers are used to denote the same elements as in the Background of the Invention.

Figure 1:
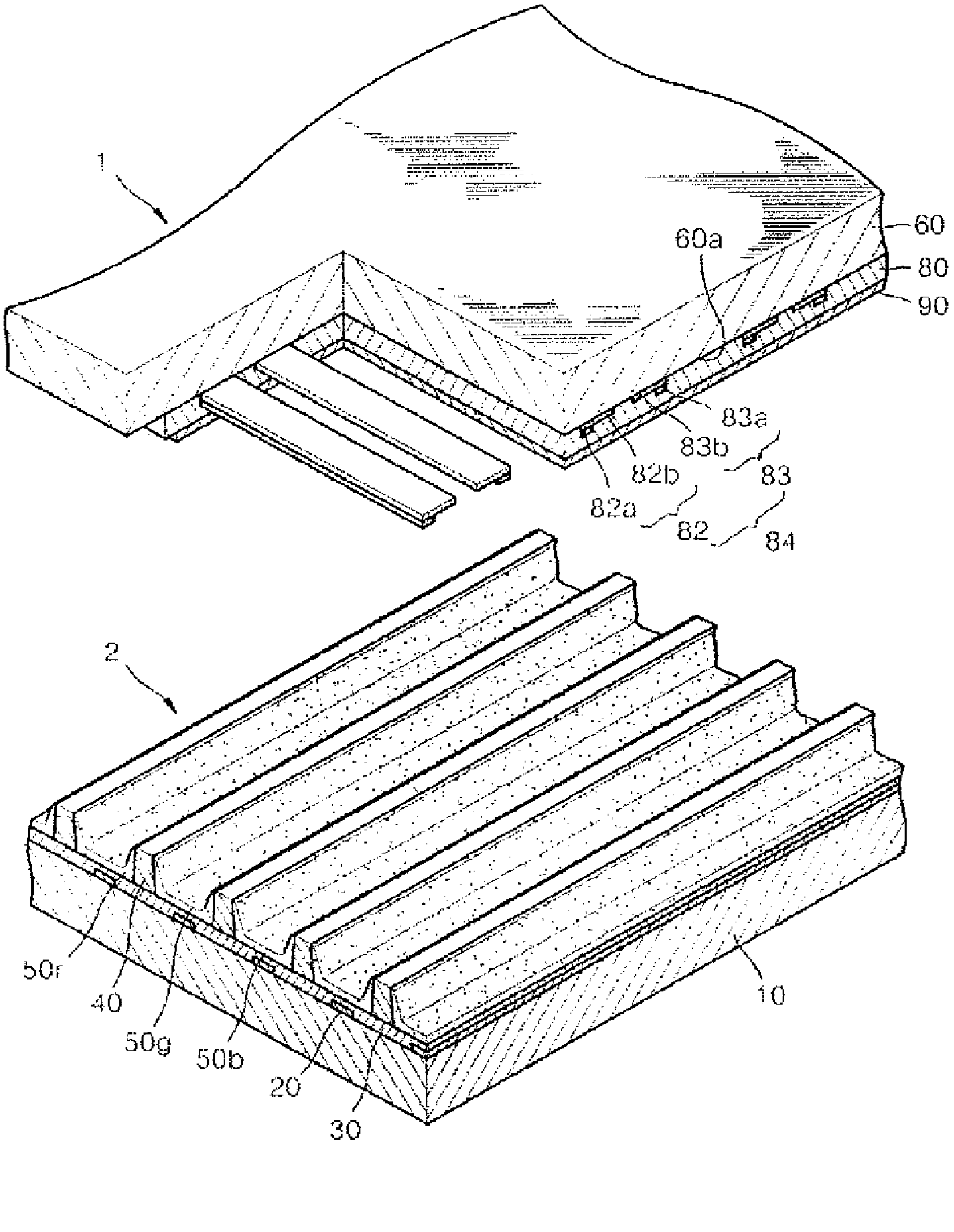
FIG. 1 is a fragmentary perspective view of a conventional plasma display panel (PDP) as disclosed in Japanese Patent Laid-Open Publication No. 1998-172442.
Figure 2:
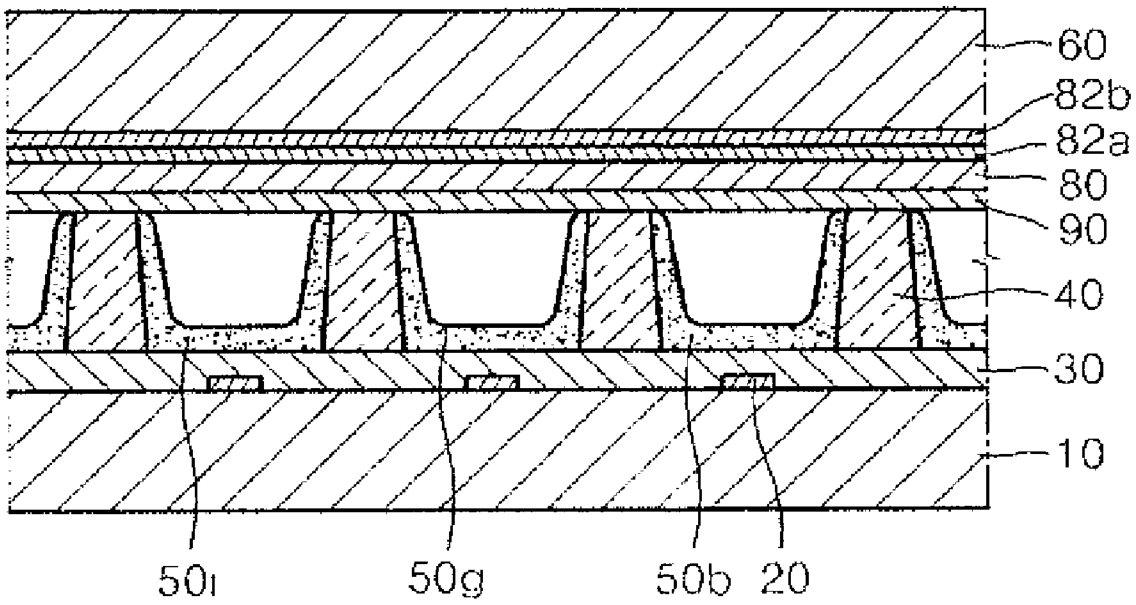
FIG. 2 is a cross sectional view of an assembly of the PDP shown in FIG. 1.
Figure 3:
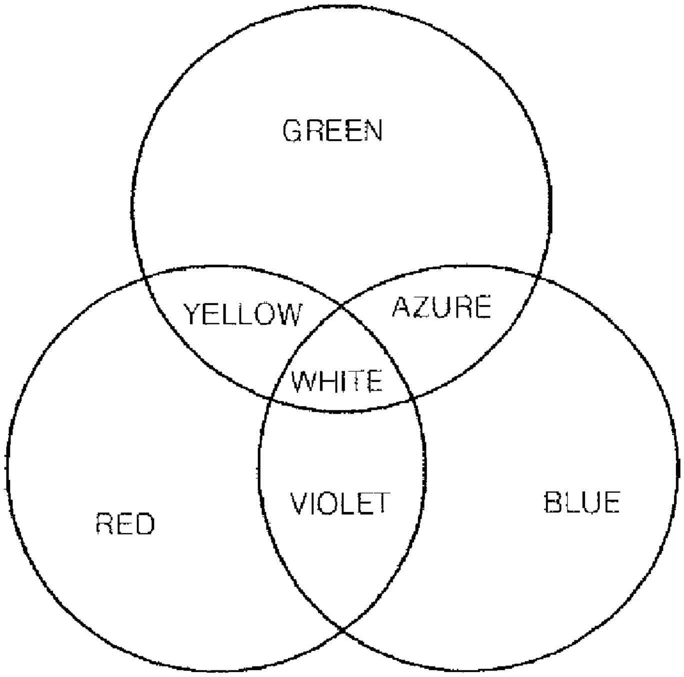
FIG. 3 is a diagram for schematically explaining the principles of additive mixture of colors and subtractive mixture of colors.
Figure 3:
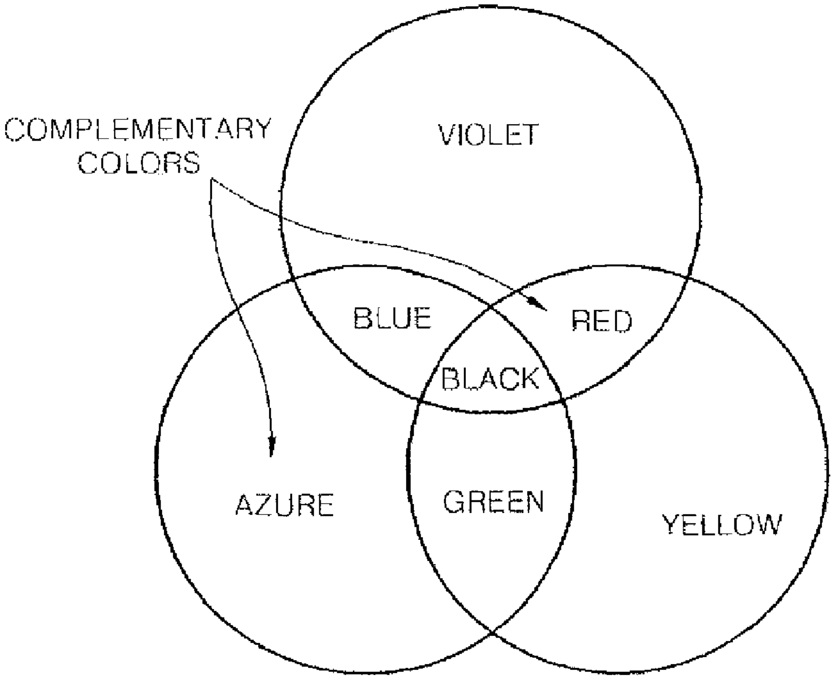
Figure 4:
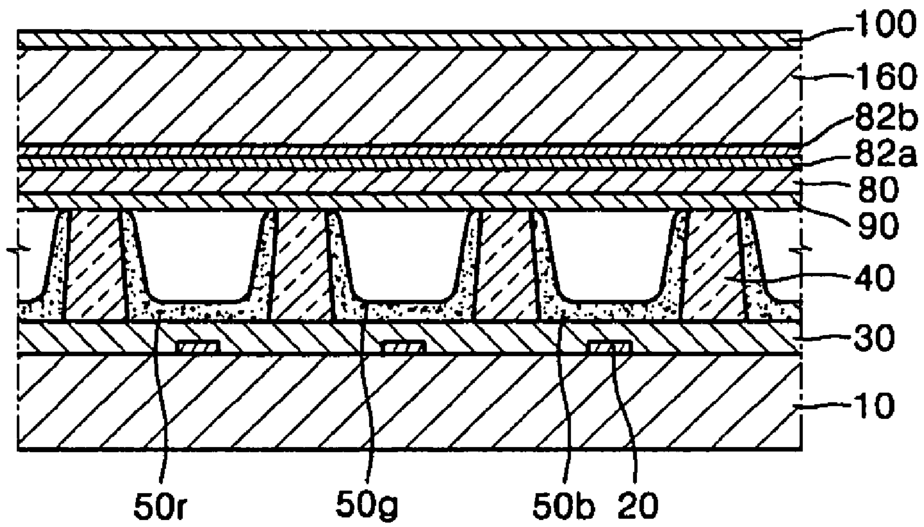
FIG. 4 is a cross sectional view of a PDP according to an exemplary embodiment.

FIG. 4 is a cross sectional view of a PDP according to an exemplary embodiment.

Referring to FIG. 4, the PDP according to the present embodiment includes a colored front substrate 160 and a colored transparent thin layer 100, which is attached to a front surface of the front substrate 160. As can be seen from FIG. 4, a bus electrode 82*b*, for example, an indium tin oxide (ITO) electrode 82*a*, a front dielectric layer 80, barrier ribs 40, phosphor layers 50*r*, 50*g*, and 50*b*, a rear dielectric layer 30, address electrodes 20, and a rear substrate 10 are sequentially stacked on a rear surface of the front substrate 160 and may form a surface-discharge-type tri-electrode PDP. However, the present embodiments are not limited to the surface-discharge-type tri-electrode PDP and may be applied to various different PDPs and other display devices. For example, the present embodiments may also be applied to an opposing-discharge-type di-electrode PDP, a reflective PDP in which phosphors are disposed adjacent to a rear surface as shown in FIG. 4, or a transmissive PDP in which phosphors are disposed adjacent to a front substrate.

The front substrate 160 can be a transparent material, such as glass. Since the front substrate 160 is colored, it can be more absorbent of light than a transparent substrate so that a rise in the reflection brightness of the panel caused by external light can be lowered.

The thin layer 100 may be formed by printing slurry. Like the front substrate 160, the thin layer 100 can be colored, thus it can also be more absorbent of light than a transparent layer so that a rise in the reflection brightness of the panel caused by external light can be lowered. Although the thin layer 100 is preferably attached to the front surface of the front substrate 160 for simplicity in performing the process, the present embodiments are not limited thereto. For instance, the thin layer 100 may be attached to rear surfaces of the barrier ribs 40.

Also, when the colors that are put on to the front substrate 160 and/or the thin layer 100 are mixed, the mixture of the colors lowers in brightness and chroma. In particular, when the two colors are complementary to each other, the mixture of the colors is close to a black color. Therefore, the light absorptivity of the PDP is further elevated, thus more effectively lowering the reflection brightness of the panel affected by external light.

In one embodiment, the colors put on components of the PDP are not white or not whitish.

As is known, contrast decreases as the reflection brightness of a panel affected by external light increases. Accordingly, the PDP having the above-described construction can improve in contrast.

Figure 5:
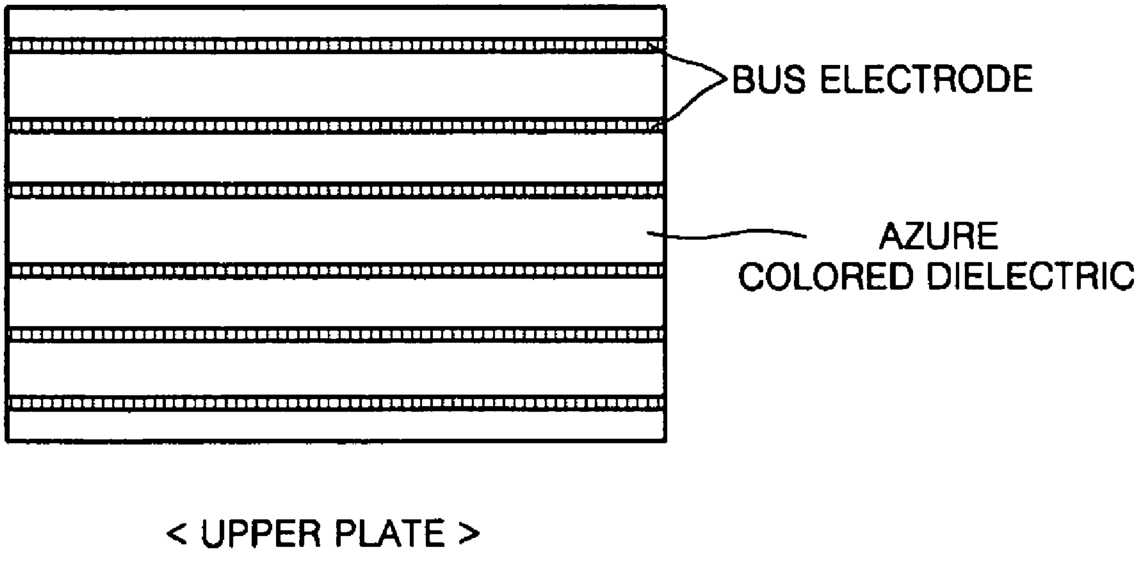
FIGS. 5 through 7 are diagrams for explaining the principle of an improvement in the contrast of a PDP according to another exemplary embodiment.
Figure 6:
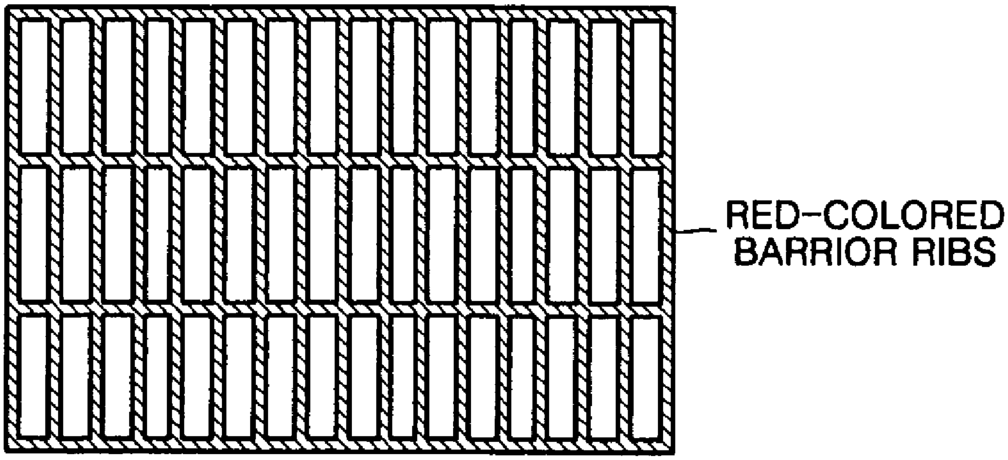
Figure 7:
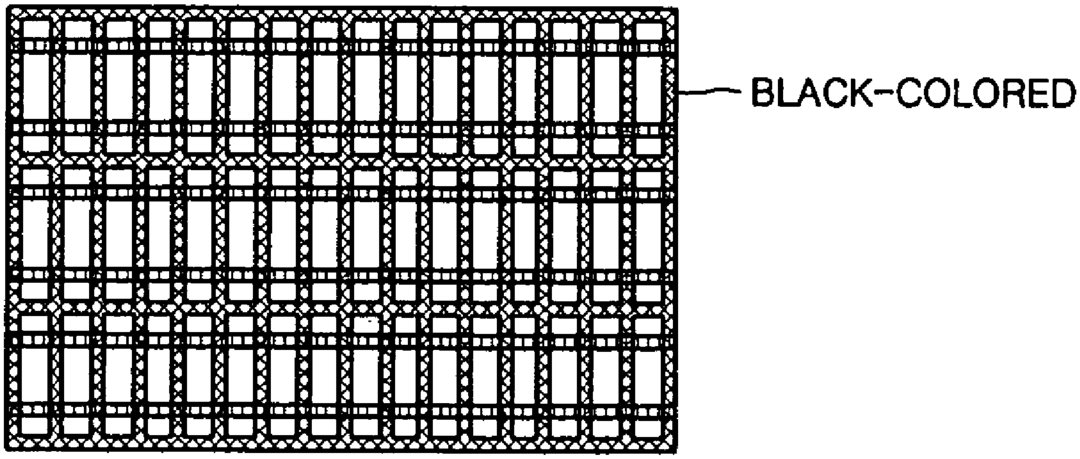

FIGS. 5 through 7 are diagrams for explaining the principle of an improvement in the contrast of a PDP according to another exemplary embodiment.

Referring to FIG. 5, an upper plate including a front dielectric layer formed of a colored dielectric material combines with a lower plate including colored barrier ribs to form a PDP. The PDP of FIG. 5 can attain the same effects as described in the previous embodiment with reference to FIG. 4.

Specifically, colors that are put in to the dielectric material and the barrier ribs are mixed using subtractive mixture of colors, the mixed color lowers brightness and chroma. Thus, the light absorptivity of the PDP increases, and the reflection of external light decreases. As a result, the panel shows a drop in reflection brightness and improves contrast. Like in the previous embodiment, an improvement in contrast can be maximized using complementary colors.

For example, barrier ribs of FIG. 6 can be formed of a red dielectric material, and the dielectric layer of FIG. 5 can be formed of an azure dielectric material. When the barrier ribs of FIG. 6 combine with the dielectric layer of FIG. 5 in the PDP, portions where the red barrier ribs overlap the azure dielectric layer have lower brightness and lower chroma as can be shown in FIG. 7 and, preferably, take on a black color. As a result, the PDP improves in contrast.

In addition to the PDPs according to the foregoing two exemplary embodiments, four different examples of PDPs with improved contrast can be obtained as follows.

First, a front dielectric layer and a front substrate can be colored with colors, which are mixed using subtractive mixture of colors to make both brightness and chroma lower, thus improving contrast.

Second, when a front dielectric layer is colored and a colored thin layer is coated on a front surface of a front substrate, the front dielectric layer and the thin layer can be colored with colors, which are mixed using subtractive mixture of colors to make both brightness and chroma lower, thus improving contrast.

Third, a front substrate and barrier ribs can be colored with colors, which are mixed using subtractive mixture of colors to make both brightness and chroma lower, thus improving contrast.

Fourth, when a colored thin layer is coated on a front surface of a front substrate and colored barrier ribs are used, the thin layer and the barrier ribs are colored with colors, which are mixed using subtractive mixture of colors to make both brightness and chroma lower, thus improving contrast.

In the above-described four exemplary embodiments, when two elements are colored with complementary colors, an improvement in contrast can be maximized.

According to the present embodiments as explained thus far, whatever construction the PDP has, the contrast of the PDP can be enhanced through simple processes.

While the present embodiments have been particularly shown and described with reference to exemplary embodiments thereof, it will be understood by those of ordinary skill in the art that various changes in form and details may be made therein without departing from the spirit and scope of the present embodiments as defined by the following claims.

What is claimed is:

1. A plasma display panel comprising:

a front substrate configured to transmit visible rays;

a rear substrate disposed substantially parallel to the front substrate;

barrier ribs interposed between the front and rear substrates and with the front and rear substrates defining a plurality of discharge cell;

two or more discharge electrodes disposed on at least one of the front substrate, the rear substrate, and the barrier ribs;

a dielectric layer disposed on the rear surface of the front substrate;

phosphor layers disposed in the discharge cells; and a discharge gas in the discharge cells, wherein any two of the front substrate, the dielectric layer, and the barrier ribs are colored, and wherein when the colors of the two of the front substrate, the dielectric layer, and the barrier ribs are mixed using subtractive mixture of colors, the resulting mixed color lowers both brightness and chroma of light reflected from the panel.

2. The panel according to claim 1, wherein the front substrate and the dielectric layer are colored.

3. The panel according to claim 1, wherein the front substrate and the barrier ribs are colored.

4. The panel according to claim 3, wherein only top surfaces of the barrier ribs are colored.

5. The panel according to claim 1, wherein the dielectric layer and the barrier ribs are colored.

6. The panel according to claim 1, wherein the colors are substantially complementary colors, which are mixed using subtractive mixture of colors so that the mixed color takes on a substantially black color.

7. A plasma display panel comprising:

a front substrate configured to transmit visible rays;

a rear substrate disposed substantially parallel to the front substrate;

barrier ribs, comprising a dielectric material, interposed between the front and rear substrates and with the front and rear substrates defining a plurality of discharge cells;

two or more discharge electrodes disposed on at least one of the front substrate, the rear substrate, and the barrier ribs;

a dielectric layer disposed on the rear surface of the front substrate;

phosphor layers disposed in the discharge cells;

a discharge gas in the discharge cells; and a colored transparent thin layer attached to the front substrate, wherein any one member of the front substrate, the dielectric layer, and the barrier ribs is colored, and wherein when the color of the transparent thin layer and the color of the ribs are mixed using subtractive mixture of colors, the resulting mixed color lowers both brightness and chroma of light reflected from the panel.

8. The panel according to claim 7, wherein front substrate is colored.

9. The panel according to claim 7, wherein the dielectric layer is colored.

10. The panel according to claim 7, wherein the barrier ribs are colored.

11. The panel according to claim 10, wherein only top surfaces of the barrier ribs are colored.

12. The panel according to claim 7, wherein the thin layer is attached to the front surface of the front substrate.

13. The panel according to claim 7, wherein the mixed color takes on a substantially black color.

14. The panel according to claim 1, wherein the plasma display panel is an opposing-discharge type panel.

15. The panel according to claim 1, wherein the plasma display panel is a transmissive type panel.

* * * * *